(12) United States Patent  (10) Patent No.: US 7,751,198 B2
Weber et al.                 (45) Date of Patent:     Jul. 6, 2010

(54) MULTI-CONNECTOR ASSEMBLY

(75) Inventors: Douglas Joseph Weber, Arcadia, CA (US); Pinida Jan Moolsintong, St. Louis, MO (US)

(73) Assignee: Apple Inc., Cupertino, CA (US)

( * ) Notice: Subject to any disclaimer, the term of this patent is extended or adjusted under 35 U.S.C. 154(b) by 708 days.

(21) Appl. No.: 11/519,308

(22) Filed: Sep. 11, 2006

(65) Prior Publication Data

US 2008/0062659 A1    Mar. 13, 2008

(51) Int. Cl.
    *H05K 5/00*    (2006.01)
(52) U.S. Cl. ................... 361/752; 361/790; 361/800
(58) Field of Classification Search ........... 361/600, 361/730, 752, 790, 797, 727, 737; 312/223
    See application file for complete search history.

(56) References Cited

U.S. PATENT DOCUMENTS

| | | | |
|---|---|---|---|
| 5,554,847 A | 9/1996 | Salvio et al. | |
| 6,154,360 A * | 11/2000 | Kaczeus et al. | 361/679.34 |
| 6,233,159 B1 | 5/2001 | Harman et al. | |
| 6,721,176 B2 * | 4/2004 | Kwong et al. | 361/679.33 |
| 6,776,660 B1 | 8/2004 | Kubota et al. | |
| 6,896,542 B2 | 5/2005 | Chang | |
| 7,090,542 B2 | 8/2006 | Zheng et al. | |
| 7,108,553 B2 * | 9/2006 | Zhu et al. | 439/607.01 |
| 2005/0240705 A1 | 10/2005 | Novotney et al. | |
| 2008/0064235 A1 | 3/2008 | Weber et al. | |

* cited by examiner

*Primary Examiner*—Hung S Bui
(74) *Attorney, Agent, or Firm*—Kramer Levin Naftalis & Frankel LLP

(57) ABSTRACT

The present invention can relate to multiple-connector assemblies for use in, for example, electronic devices. Each of the connectors are constrained to another connector by aligning one or more complementary sets of reference features. A locating bracket may be used to couple multiple connectors together. Alternatively, the connectors may be coupled to each other directly. The electronic device also may include a retainer coupled to the connectors (either directly or indirectly through the locating bracket). The retainer and a surface of one of the connectors may form a single plane to which an end cap of the housing may be coupled, thereby accurately locating the end cap with respect to the connectors. The present invention also can relate to methods of manufacturing such an electronic device.

36 Claims, 12 Drawing Sheets

MULTI-CONNECTOR ASSEMBLY

FIELD OF THE INVENTION

The present invention can relate to methods and apparatus for constraining multiple connectors in an electronic device in one or more degrees of freedom.

BACKGROUND OF THE INVENTION

In a consumer electronic device, the distance between an input/output (I/O) connector and the housing of the electronic device and the distance between multiple I/O connectors can be very important. For example, these distances can determine whether and which devices are compatible with accessories. Accessories can include docks, printers, external storage devices, external displays, speakers, lanyards having headphones coupled thereto, and other audio and/or visual output devices. If one or more of the connectors are misaligned with any other connector, an accessory may not be able to properly couple with the device, and may accelerate the amount of wear and tear experienced by one or both sides of the connection.

For example, in some of these electronic devices, the player may have two I/O connectors—a multiple-pin connector and a separate audio connector. If the multiple-pin connector or audio connector, for example, resides too deep within the housing of the device, accessories may not be able to electrically connect to the device properly. As a result, the electronic device may not be able to transmit data to or receive data from an accessory, the user may not be able to hear sound played by the electronic device, or the sound quality may be degraded. If the multiple-pin connector and the audio connector are misaligned with respect to each other, it may be difficult or impossible to couple accessories to the electronic device when the accessories are configured to couple to both connectors simultaneously.

SUMMARY OF THE INVENTION

The present invention can include an electronic device having multiple connectors aligned to each other using one or more complementary sets of reference features. One embodiment of the present invention can include a locating bracket configured to constrain the connectors in one or more degrees of freedom. The locating bracket may be coupled to a first connector, creating a solid reference feature or structure that accurately defines the distance to the first connector. The locating bracket then can be used to couple the first connector with another connector or with other parts of the electronic device. In another embodiment, the connectors can be coupled directly to each other through alignment of complementary reference features disposed on the connectors themselves. As a result, the connectors can be constrained in one or more degrees of freedom without the use of a locating bracket.

In one embodiment of the present invention, the electronic device can include a retainer that can be coupled to one or more reference features on the locating bracket, one or more of the connectors, and/or other components of the electronic device. When coupled to the reference feature(s), the distance from an end cap of the housing to at least one of the connectors can be precisely defined. The end cap of the housing can include one or more openings that permit accessories to access the connectors, e.g., to couple the electronic device to a dock or audio output device.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DETAILED DESCRIPTION OF THE INVENTION

Figure 1A:
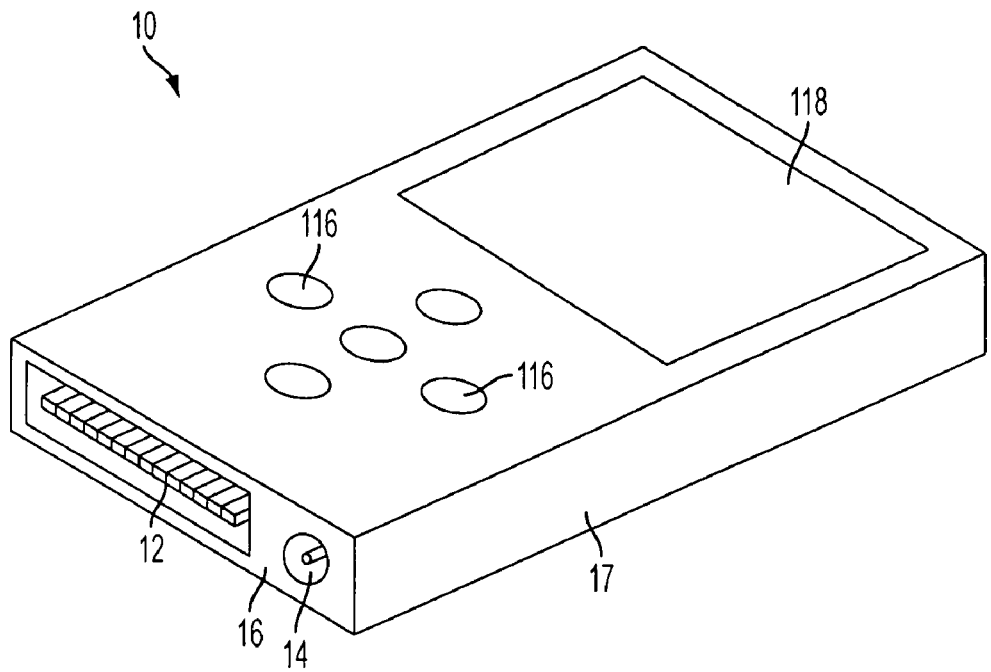
FIG. 1A illustrates an exemplary electronic device that can incorporate the present invention.

FIG. 1A illustrates an exemplary electronic device that can incorporate the present invention. Electronic device 10 can be any electronic device having multiple connectors or connector parts, e.g., multiple-pin connector 12 and audio connector 14. The distance from end face 16 of housing 17 to connectors 12 and 14 can affect the quality of the electrical connection between the electronic device and an accessory configured to be coupled to the device, such as a computer, a printer, a display, speakers, audio system, headphones, a dock, a lanyard, or a combination thereof. The distance between connectors 12 and 14 also can affect how well an accessory mechanically and electrically couples to electronic device 10. If one or more of the connectors are misaligned, accessories may not be able to couple to the device properly, or, more importantly, may not be able to access one or more of the connectors at all.

In some electronic devices, connectors may be precisely positioned relative to each other and to the housing of the device by mechanically and electrically coupling the connectors directly to a circuit board before the circuit board is placed in the housing. This assembly then may be coupled directly to the housing and the end face.

Figure 1B:
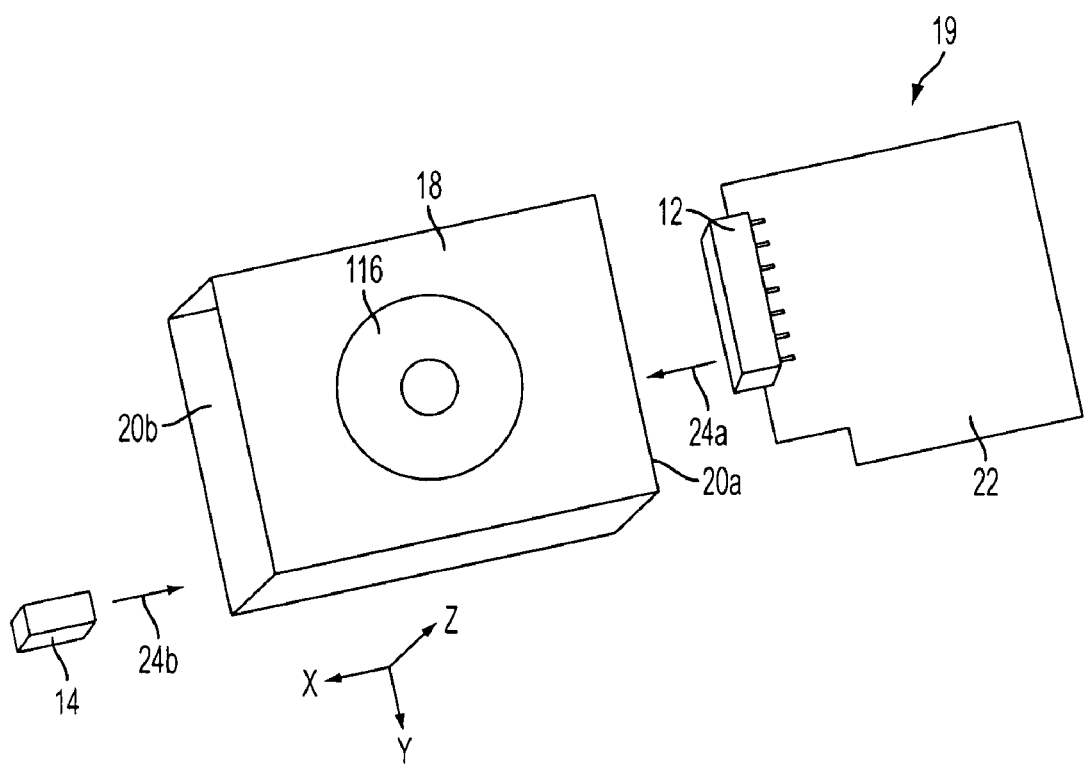
FIG. 1B illustrates the assembly of some components of the electronic device of FIG. 1A.

However, it may not be desirable or possible in some designs of housings to couple end face 16 directly to the connector/circuit board assembly and/or to mechanically couple audio connector 14 directly to the circuit board before the circuit board is disposed within the housing. For example, as shown in FIG. 1B, housing 18 of electronic device 10 may be designed so that it may be more desirable to insert internal components of the device into one or more openings 20a,b disposed at different sides (e.g., opposing ends) of housing 18 (as opposed to, e.g., clamshell housing). It may be more desirable to couple multiple-pin connector 12 to circuit board 22 first (forming circuit board assembly 19) and then separately couple audio connector 14 to circuit board 22 after circuit board assembly 19 is inserted into housing 18 via opening 20a.

If audio connector 14 had been soldered onto the circuit board before inserting the circuit board assembly into housing 18, it may have been difficult or impossible to insert the assembly fully into the housing, for example, due to obstructions. Such obstructions may include components already disposed within the housing, protrusions or narrowing inside the housing, a small cross-sectional area of opening 20a, a small z-height in the interior of the housing, or combinations thereof. As used herein, the z-height of a component may be the thickness of the component in the z-direction as indicated in FIG. 1B.

The obstructions may make it impossible or impractical from a manufacturing standpoint to pre-assemble audio connector 14 to the circuit board before the circuit board is inserted into the housing. For example, user input component 116 may be disposed within housing 18 before circuit board assembly 19 is inserted into the housing. If the z-height of user input component 116 reduces the effective z-height of portions of the housing interior to a value that is less than the z-height of audio connector 14 and less than the z-height of portions of circuit board assembly 19, it may be more desirable and practical to insert circuit board assembly 19 and audio connector 14 from different openings 20a,b and thereafter couple the two together. Furthermore, if the z-height of the audio component is only slightly less than that of the housing interior, it may not be practical from a manufacturing standpoint to attempt to slide the audio connector through the interior length of the housing.

Accordingly, manufacturing and/or design constraints may deem it more desirable for multiple-pin connector 12 (coupled to circuit board 22) to be inserted into housing 18 via first opening 20a (as shown by arrow 24a) and audio connector 14 to be inserted into housing 18 via second opening 20b (as shown by arrow 24b). Thereafter, audio connector 14 can be electrically and mechanically coupled to circuit board 22 either directly or indirectly.

This type of manufacturing and design scenario can pose many challenges. When connectors 12 and 14 are separately inserted into housing 18 during manufacturing, it may be difficult to precisely locate the connectors with respect to each other. Furthermore, when end face 16 closes off opening 20b of housing 18 after components of the device have been inserted therein, it may be difficult to precisely locate connectors 12 and/or 14 with respect to end face 16 in one or more degrees of freedom.

The present invention can constrain multiple connectors or connector parts in one or more degrees of freedom relative to each other and/or to an end cap of a housing for an electronic device. The present invention can accomplish this by providing each connector or part with one or more references features to which other connector(s) and/or a locating bracket can be aligned and coupled. By aligning connector(s) and/or locating brackets with the reference features, the distance between connectors can be constrained. One embodiment of the present invention can also include a retainer that can be coupled to one or more reference features on either the locating bracket, one or more of the connectors, and/or other components of the electronic device. When coupled to the reference feature(s), the distance from an end cap of the housing to at least one of the connectors may be constrained in a predetermined and repeatable way.

Figure 2:
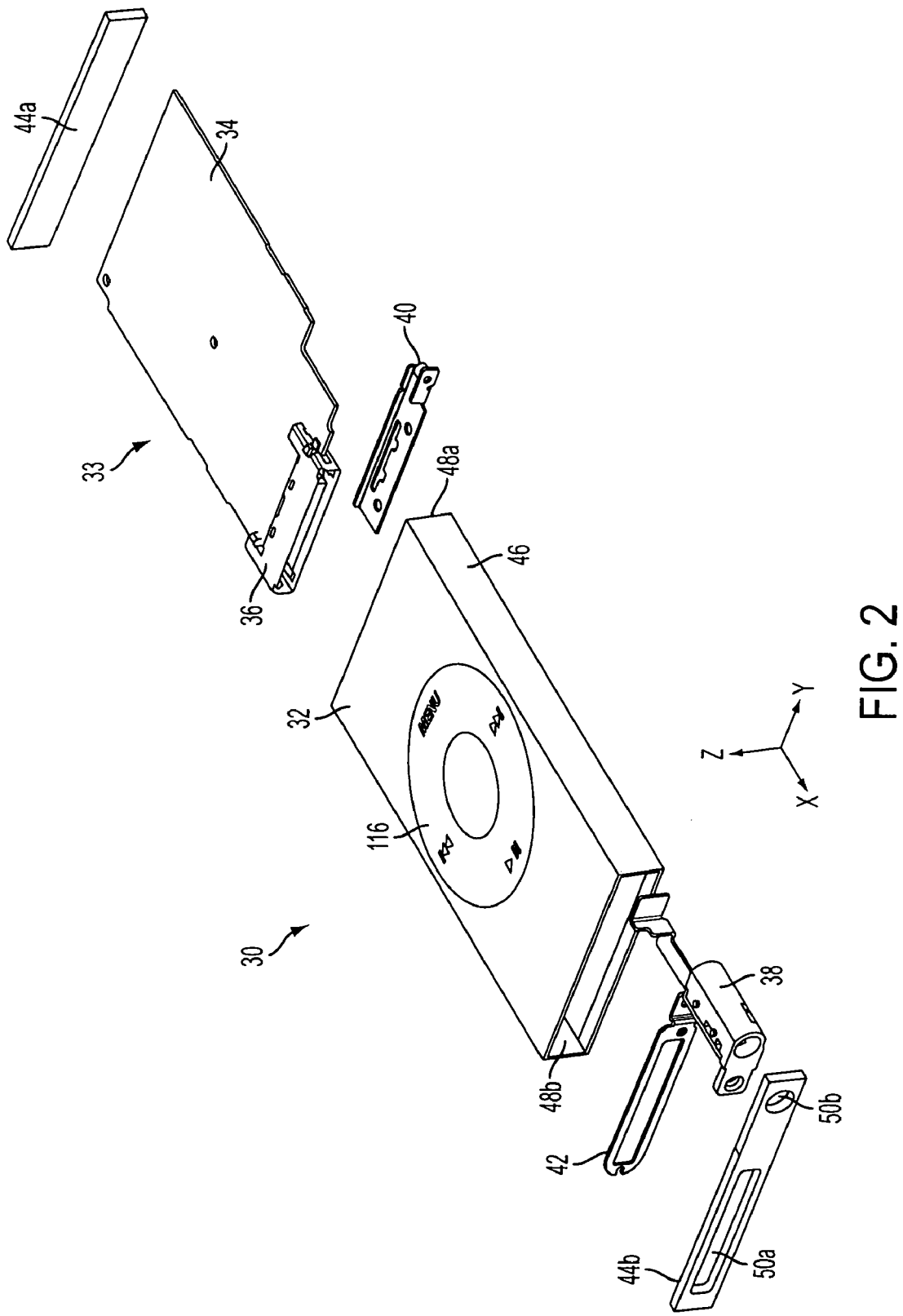
FIG. 2 illustrates an exploded view of some components of the electronic device of FIG. 1A.

FIG. 2 shows a first embodiment of the present invention. Device 30 can include housing 32, circuit board 34, multiple-pin connector 36, audio connector 38, locating bracket 40, and retainer 42. Housing 32 can include body portion 46 and openings 48a and 48b disposed at opposing ends of the housing. Housing 32 also can include end caps 44a and 44b. End cap 44b can include multiple-pin connector opening 50a and audio connector opening 50b disposed through the end cap to permit accessories to access multiple-pin connector 36 and audio connector 38 when device 30 is fully assembled. Locating bracket 40 can create a solid reference feature or structure that accurately defines the distance to multiple-pin connector 36. This structure then can be used to couple with other parts in the assembly.

In one embodiment of the present invention, multiple-pin connector 36 may have 30 pins that transmit data to and from the electronic device. Multiple-pin connector 36 may be similar to that described in U.S. Pat. No. 6,776,660 to Kubota et al., which is incorporated herein by reference in its entirety. Multiple-pin connector 36 also may have an interface system similar to that described in U.S. Pat. No. 7,441,062 to Novotney et al., which is incorporated herein by reference in its entirety. In alternative embodiments, multiple-pin connector 36 may have any configuration known in the art or otherwise.

During manufacturing, multiple-pin connector 36 can be mechanically and electrically coupled to circuit board 34. Locating bracket 40 then can be coupled to multiple-pin connector 36 in a manner described in more detail hereinbelow. Resulting circuit board assembly 33 can be inserted into housing 32 through first opening 48a. A cross-sectional area of the circuit board assembly may be equal to or less than that of the opening in order for the circuit board assembly to be inserted therethrough. If additional electrical components are preassembled to the circuit board, e.g., a display or battery, the cross-sectional area of opening 48a may be large enough to also accommodate those electrical components.

Once circuit board assembly 33 is disposed within the housing, retainer 42 and audio connector 38 can be inserted into housing 32 through second opening 48b. One skilled in the art can appreciate that cross-sectional areas of audio connector 38 and retainer 42 each may be equal to or less than that of opening 48b in order for those components to be inserted therethrough.

Once the retainer and audio connector are disposed within housing, the components may be coupled to multiple-pin connector 36 via locating bracket 40. This may constrain retainer 42 and audio connector 38 to multiple-pin connector 36 in one or more degrees of freedom. Outer facing surfaces on retainer 42 and audio connector 38 can form a single plane to which end cap 44b is coupled. End cap 44a also can be coupled to device 30, closing off opening 48a of housing 32.

Figure 3:
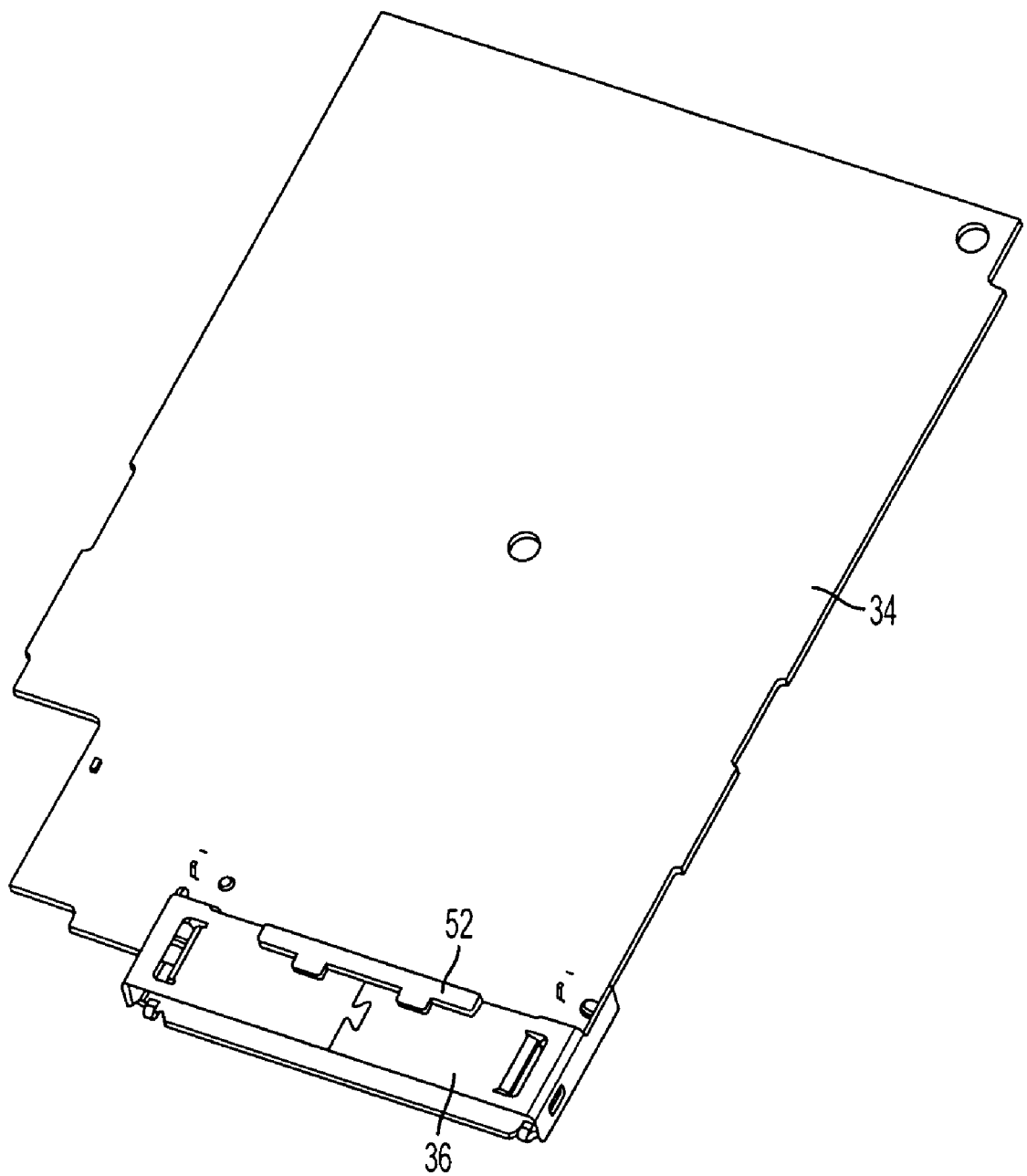
FIG. 3 illustrates an assembly of a circuit board and multiple-pin connector of the first embodiment of the present invention.

FIG. 3 shows an enlarged illustration of multiple-pin connector 36. Multiple-pin connector 36 may be configured to be electrically and mechanically coupled to circuit board 34 before it is inserted into the housing of the electronic device. Multiple-pin connector 36 can incorporate multiple-pin connector reference feature 52, which in one embodiment of the present invention, can include a raised extension of the multiple-pin connector's inner molded plastic. Alternatively, reference feature 52 may be formed as part of the metal casing of the multiple-pin connector or made separately from the connector and then coupled thereto. Reference feature 52 (as with all of the reference features discussed herein) can be any shape. In one embodiment, reference feature 52 can have a shape that permits a complementary reference feature on locating bracket 40 to couple to reference feature 52 in a predetermined (e.g., one) configuration. For example, in one embodiment of the present invention, reference feature 52 may have an elongated body portion with side portions that can cause the reference feature to be asymmetrical about the longitudinal axis of the reference feature.

Figure 4:
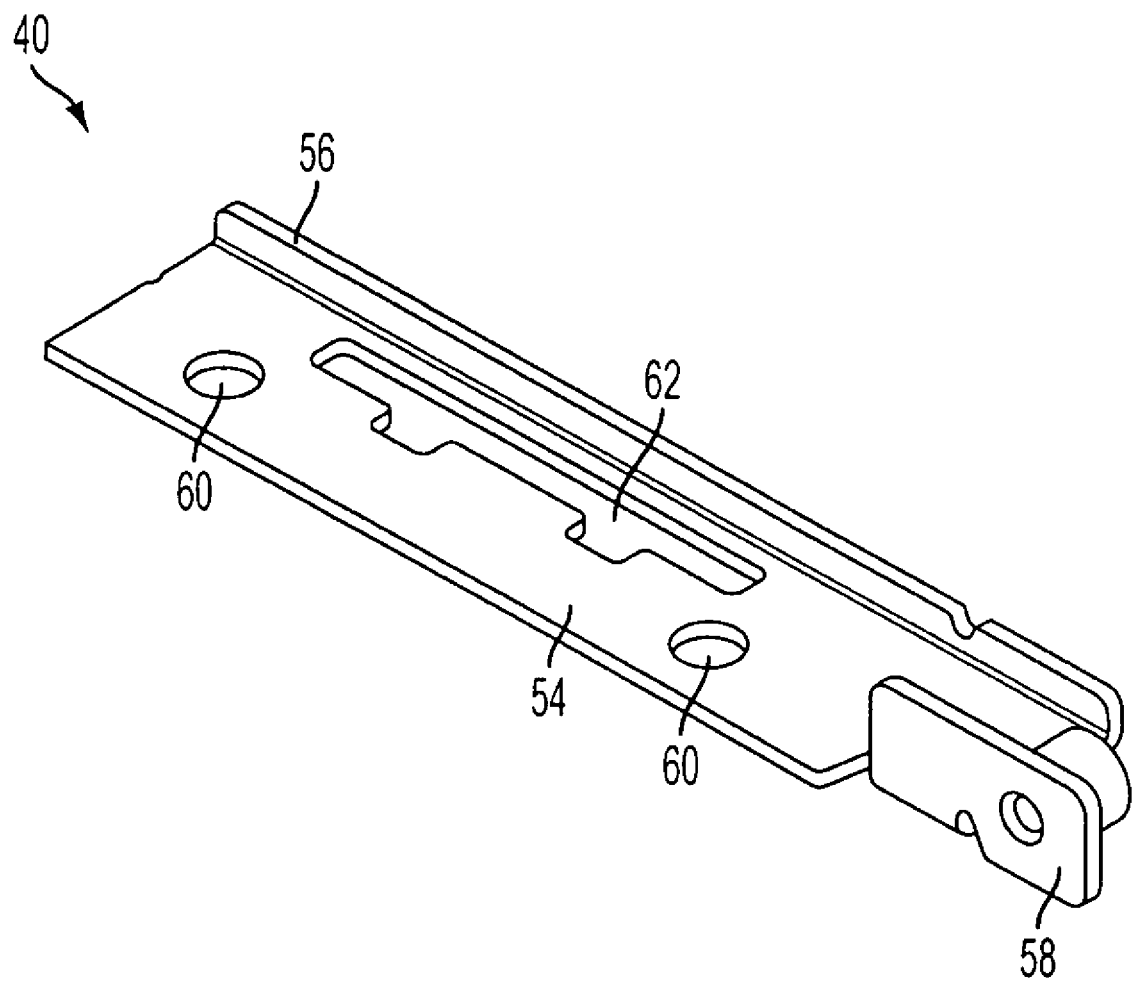
FIG. 4 illustrates a locating bracket of the first embodiment of the present invention.

FIG. 4 illustrates an enlarged view of locating bracket 40. Locating bracket 40 can include body portion 54, lip 56, and first bracket reference feature 58. Lip 56 may be disposed at an angle to body portion 54 and rest against an edge of multiple-pin connector 36 when the locating bracket is coupled thereto. In one embodiment of the present invention, first bracket reference feature 58 can incorporate a threaded insert to which audio connector 38 and retainer 42 may be screwed to constrain those components to multiple-pin connector 36 in one or more degrees of freedom.

Body portion 54 can include solder holes 60 and second bracket reference feature 62. Locating bracket 40 may be manufactured by stamping and folding a rigid sheet metal part that can be soldered or welded to multiple-pin connector 36 via solder holes 60. Alternatively, locating bracket 40 can be manufactured by another method known in the art or otherwise, and welded, adhered, or otherwise coupled to multiple-pin connector 36.

Second bracket reference feature 62 may be a cutout having a shape that complements the shape of multiple-pin connector reference feature 52. When bracket 40 is coupled to multiple-pin connector 36, second bracket reference feature 62 may surround raised multiple-pin connector reference feature 52, thereby constraining the bracket to the multiple-pin connector. Depending on the shapes of features 52 and 62, the bracket may be constrained in one or more directions.

Figure 5:
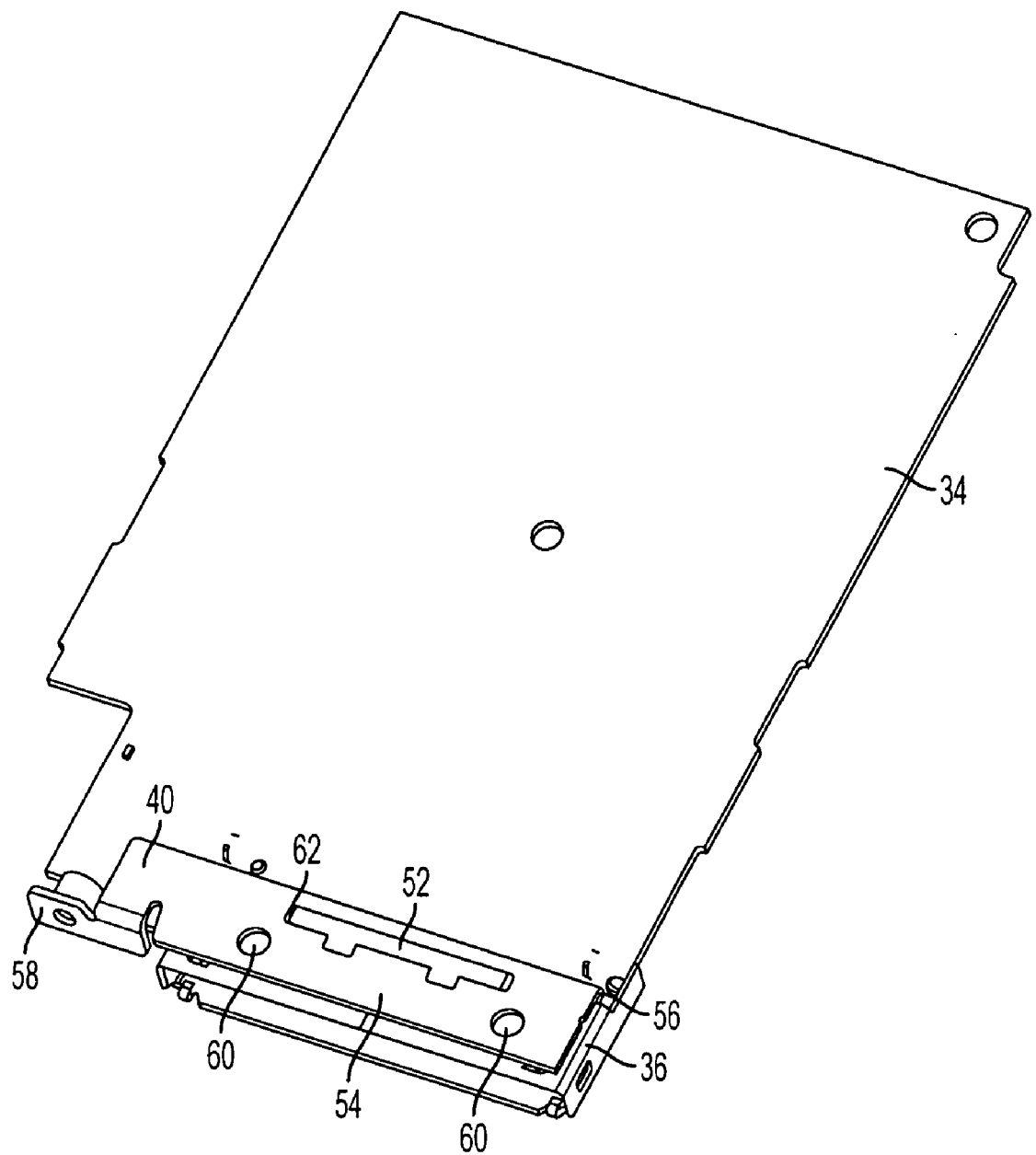
FIG. 5 illustrates an assembly of the circuit board and multiple-pin connector of FIG. 3 with the locating bracket of FIG. 4 in accordance with the present invention.

FIG. 5 illustrates an assembly of circuit board 34, multiple-pin connector 36, and locating bracket 40 in accordance with one embodiment of the present invention.

In alternative embodiments of the present invention, reference feature 52 may be a depression in connector 36, rather than a raised protuberance. Correspondingly, reference feature 62 in locating bracket 40 then may include a protuberance having a complementary shape. Also, reference feature 52 may include more than one structure or protuberance, with a like number of complementary reference features on locating bracket 40. Reference features 52 and 62 may have complementary shapes that couple to each other so that locating bracket 40 can be constrained to multiple-pin connector 36.

Second bracket reference feature 62 also may have additional cutouts having shapes that complement the shape of multiple-pin connector reference feature 52. This can permit bracket 40 to constrain connector 36 to other components in multiple orientations or positions. Second bracket reference feature 62 also may have additional cutouts having different shapes. This can permit bracket 40 to couple to different types of connectors or connector parts having different multiple-pin connector reference features.

Figure 6:
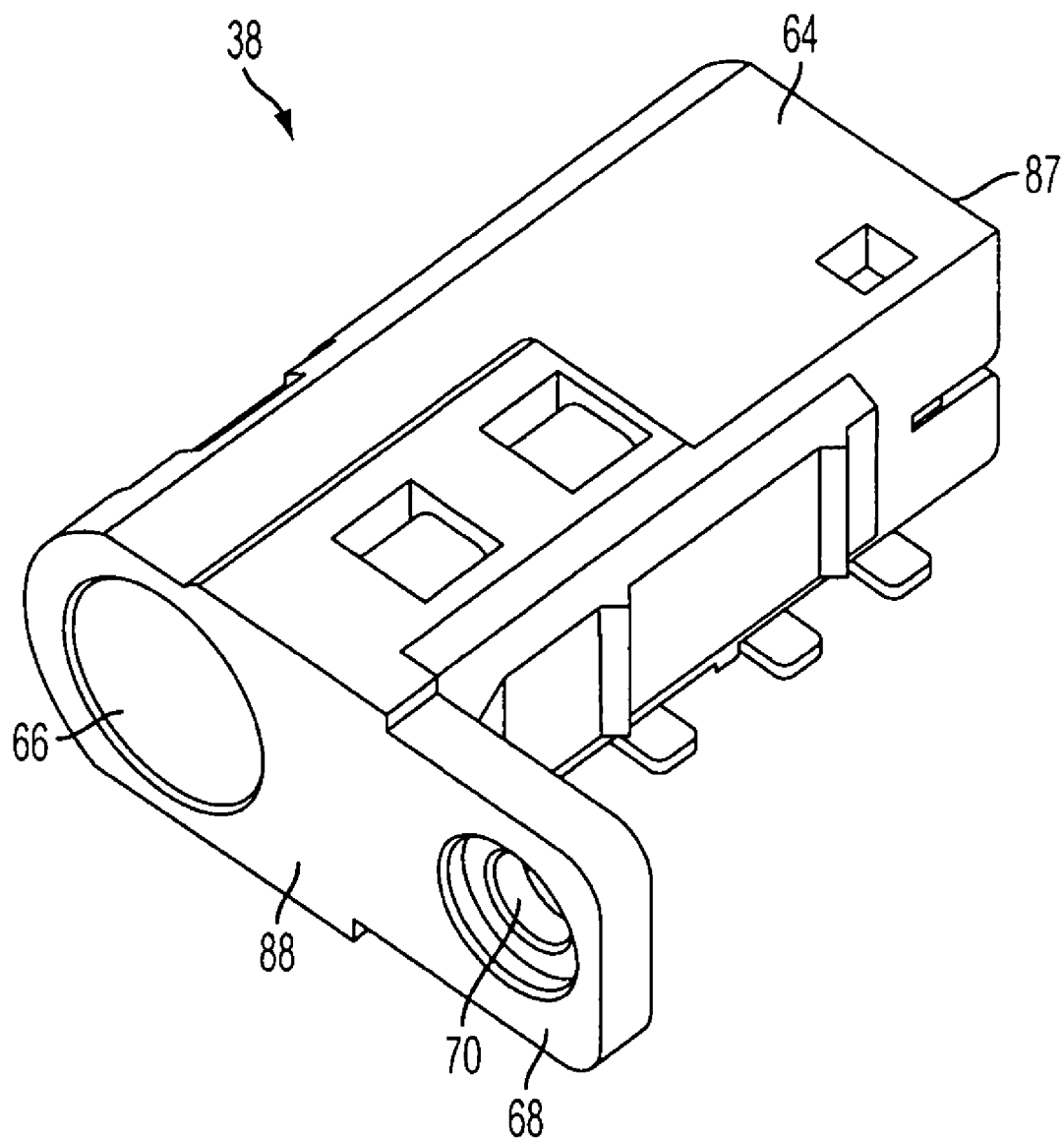
FIG. 6 illustrates an audio connector of the present invention.

FIG. 6 illustrates an exemplary audio connector of the present invention. Audio connector 38 can include body portion 64 within which audio jack receptacle 66 may be disposed. Audio connector 38 also can incorporate audio connector reference feature 68 for aligning to first bracket reference feature 58. Audio connector reference feature 68 can include through-hole 70 having an inner surface that may be threaded or smooth. In one embodiment of the present invention, the internal surface of through-hole 70 may have a smooth surface that may be dimensioned to provide a clearance fit to a screw that may be used to align and couple audio connector 38 to locating bracket 40.

Figure 7:
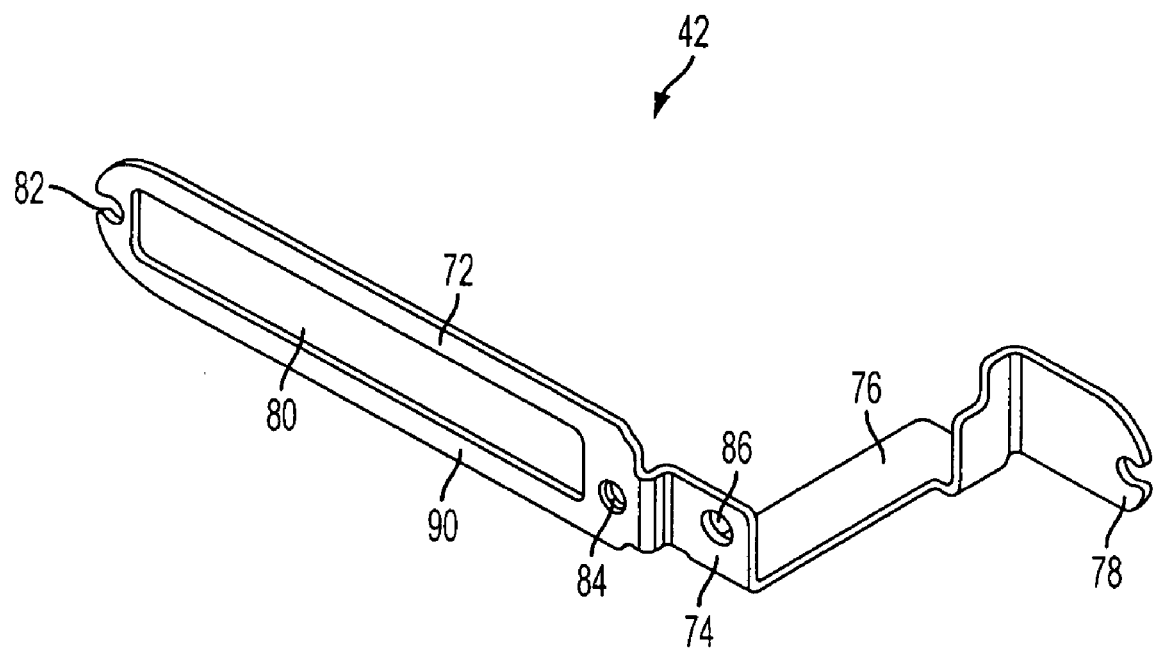
FIG. 7 illustrates a retainer in accordance with the present invention.

FIG. 7 shows an illustrative retainer of the present invention. Retainer 42 can include body portion 72, first retainer reference feature 74, appendage 76, and second retainer reference feature 78.

Body portion 72 can incorporate cutout 80 and third and fourth retainer reference features 82 and 84. When retainer 42 is assembled to the electronic device, cutout 80 may be disposed over multiple-pin connector 36 to provide accessories with access to the multiple-pin connector. Third and fourth retainer reference features 82 and 84 can include through-holes into which screws can be inserted to align and couple retainer 42 to complementary reference features (not shown) that can be disposed in multiple-pin connector 36, housing 32, and/or another structure of electronic device 30. Alternatively, solder may be disposed within the through-holes of reference features 82 and 84.

First retainer reference feature 74 can include through-hole 86 having an inner surface that may be threaded or smooth. In one embodiment of the present invention, the internal surface of through-hole 86 may have a smooth surface that may be dimensioned to provide a clearance fit to a screw that may be used to align and couple retainer 42 to locating bracket 40.

Appendage 76 can couple first reference feature 74 to second reference feature 78. Second reference feature 78 can include a hole through which a screw can be inserted to align and couple retainer 42 to a complementary reference feature (not shown) that can be disposed on circuit board 34, housing 32, or another structure of electronic device 30. Alternatively, solder may be disposed within the through-holes of reference feature 78. Reference feature 78 also may be aligned and coupled to a complementary reference feature disposed on inner facing surface 87 of audio connector 38 to further constrain audio connector 38 to multiple-pin connector 36 (via the intervening components).

Figure 8A:
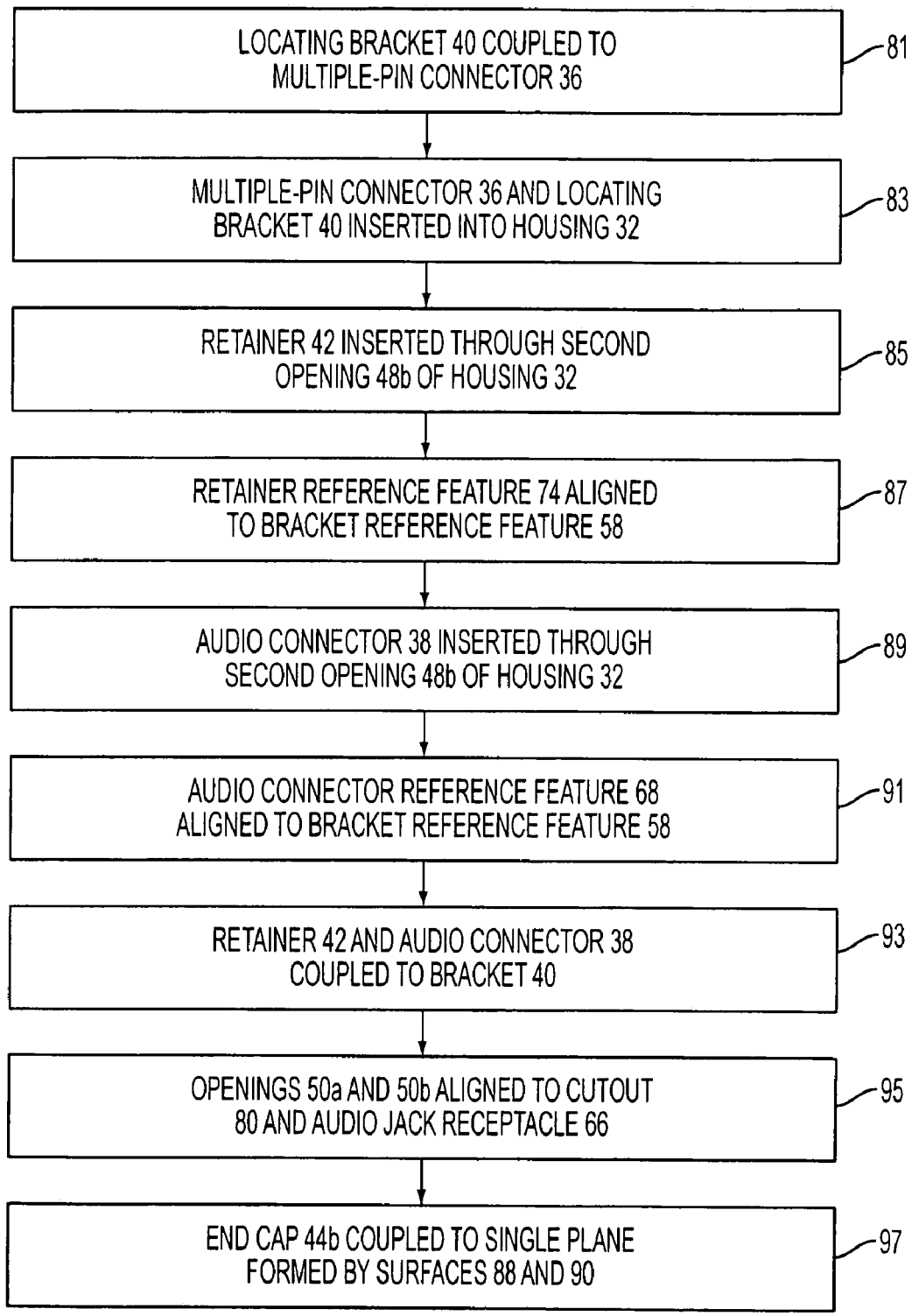
FIG. 8A provides an exemplary flowchart of steps for assembling one embodiment of an electronic device in accordance with the present invention.

FIG. 8A illustrates a flowchart of steps for assembling one embodiment of an electronic device of the present invention. In step 81, locating bracket 40 first may be coupled to multiple-pin connector 36. This can create a solid reference feature or structure that can accurately define the distance to multiple-pin connector 36. This structure then can be used to couple with other components in electronic device 30. In step 83, multiple-pin connector 36 and locating bracket 40, along with the circuit board, then may be inserted into housing 32 via first opening 48*a*.

Thereafter, in step 85, retainer 42 can be inserted through second opening 48*b* of housing 32. In step 87, first retainer reference feature 74 can be aligned to bracket reference feature 58. Audio connector 38 also can be inserted through second opening 48*b* of housing 32 (step 89) and audio connector reference feature 68 also can be aligned to bracket reference feature 58 (step 91). In step 93, retainer 42 and audio connector 38 can be coupled to bracket 40 by, for example, threading a screw through holes 70 and 86 of audio connector 38 and retainer 42 and driving the screw into bracket reference feature 58 of bracket 40. Once the retainer and audio connector have been coupled to the bracket, they are coupled indirectly to multiple-pin connector 36 (via bracket 40) and may be precisely constrained to the multiple-pin connector in one or more degrees of freedom. Retainer 42 and audio connector 38 also may be coupled to other structures in electronic device 30 by aligning their respective remaining reference features with complementary reference features disposed throughout the electronic device. Audio connector 38 may be electrically coupled to circuit board 34 in a manner described in greater detail in co-pending U.S. Patent Application Publication No. 2008-0064235 to Weber et al., entitled "ELECTRICAL COMPONENTS COUPLED TO CIRCUIT BOARDS" and filed on Sept. 11, 2006, which is incorporated herein by reference in its entirety.

Once audio connector 38 and retainer 42 are coupled to locating bracket 40, outer facing surface 88 of audio connector 38 and outer facing surface 90 of retainer 42 may form a single plane that may be accurately located to multiple-pin connector 36. However, any predetermined orientation of these parts is possible. In step 95, openings 50a and 50b of end cap 44b then can be aligned to cutout 80 of retainer 42 and audio jack receptacle 66 respectively. Thereafter, in step 97, end cap 44b can be coupled to the single plane formed by surfaces 88 and 90 by adhesion or another method known in the art or otherwise.

Figure 8B:
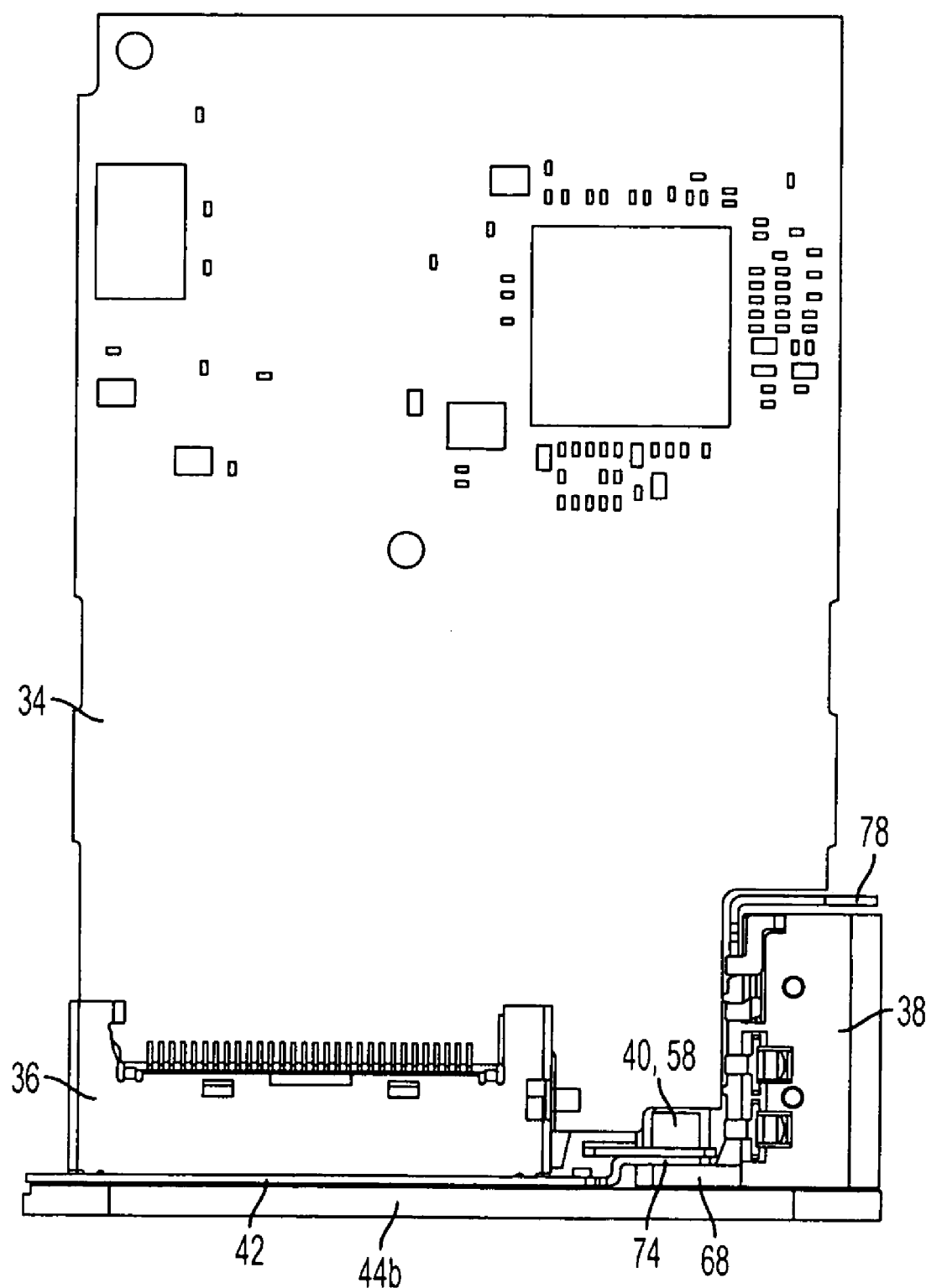
FIG. 8B illustrates an assembly of the circuit board and multiple-pin connector of FIG. 3, the locating bracket of FIG. 4, the audio connector of FIG. 6, and the retainer of FIG. 7 in accordance with the present invention.

FIG. 8B illustrates an assembly of circuit board 34, multiple-pin connector 36, locating bracket 40, audio connector 38, retainer 42, and end cap 44b in accordance with one embodiment of the present invention.

While retainer 42 is illustrated as sitting flush against an outer facing surface of multiple-pin connector 36, retainer 42 may be configured in alternative embodiments to sit at a predetermined distance from the outer facing surface of multiple-pin connector 36, which can provide a datum from which other components of the electronic device may be located. Support structures may be disposed between multiple-pin connector 36 and retainer 42 to help support retainer 42 in the proper configuration with respect to multiple-pin connector 36. Likewise, end cap 44b also may be configured in alternative embodiments to sit at a predetermined distance from retainer 42.

Figure 8C:
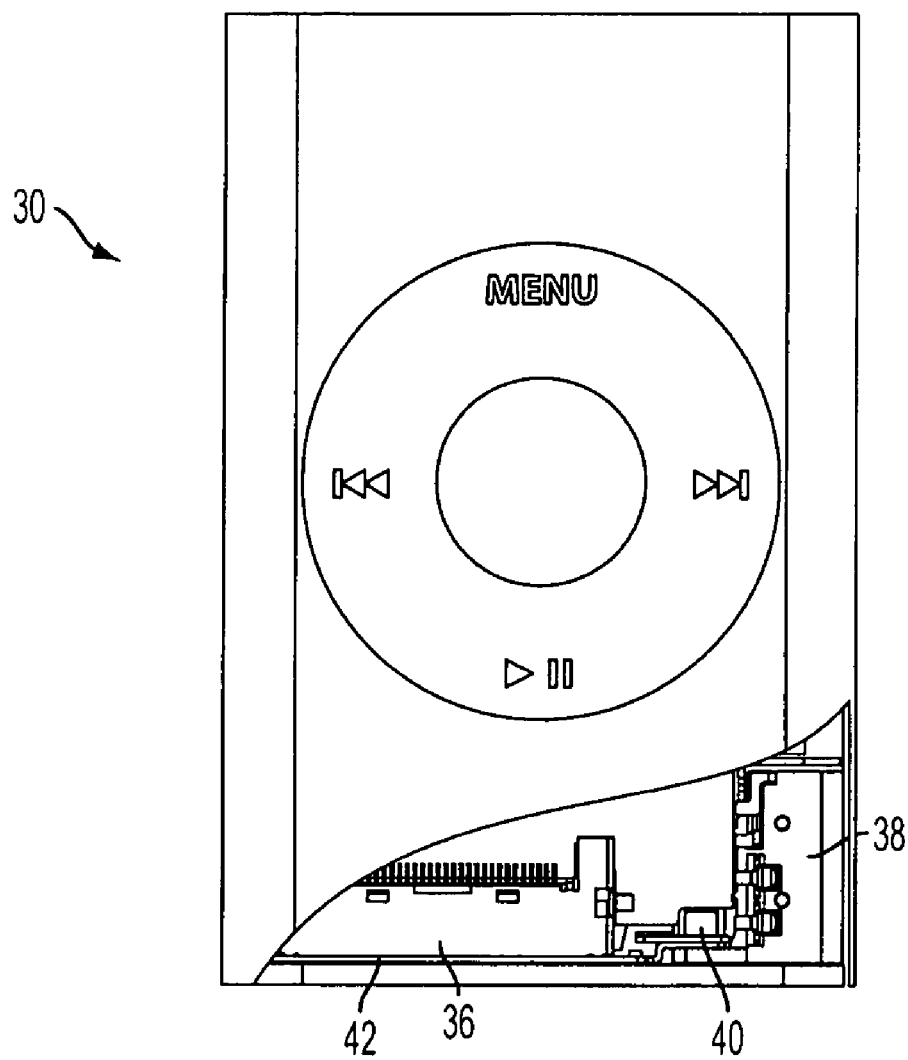
FIG. 8C illustrates the electronic device of FIGS. 2-8B with a composite connector from an accessory device in accordance with the present invention.
Figure 8C:
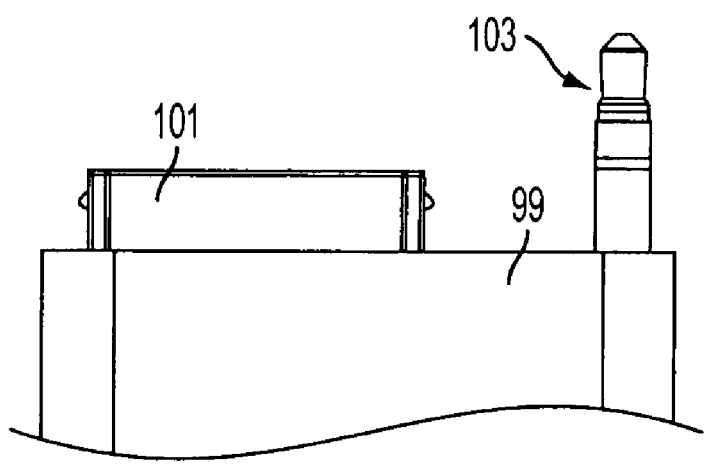

FIG. 8C illustrates the electronic device of FIGS. 2-8B with composite connector 99 of an accessory. Accessories may include a computer, a printer, a display, an audio system, speakers, headphones, a dock, a lanyard, or a combination thereof. Complementary multiple-pin connector 101 and complementary audio jack 103 may be integrated with composite connector 99. Complementary multiple-pin connector 101 may be configured to mechanically and electrically couple to multiple-pin connector 36 of electronic device 30. Complementary audio jack 103 may be configured to electrically and mechanically couple to audio jack receptacle 66 of audio connector 38 of electronic device 30.

If multiple-pin connector 36 and audio connector 38 are not aligned properly to each other, it may be difficult or impossible for a user to insert the complementary connector and audio jack of the composite connector into electronic device 30. Similarly, if either multiple-pin connector 36 or audio connector 38, for example, are disposed too deep with respect to end cap 44b, multiple-pin connector 101 or audio jack 103 may not be able to electrically connect to electronic device 30 properly. The present invention can reduce the likelihood that these problems will occur.

Figure 9:
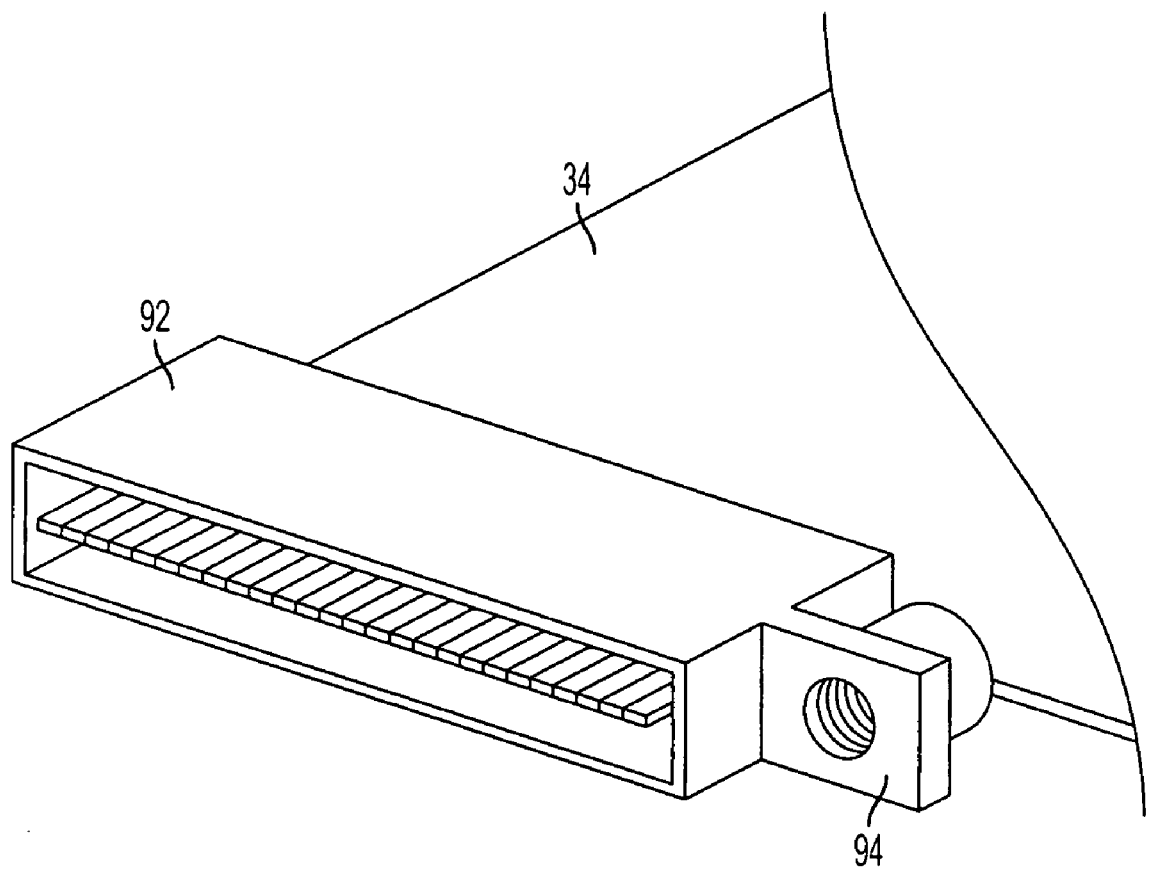
FIG. 9 illustrates a second embodiment in accordance with the present invention.

FIG. 9 illustrates a second embodiment of the present invention. One difference between the first and second embodiments is that the locating bracket may be eliminated in the second embodiment. Instead, multiple-pin connector 92 can include reference feature 94 that may serve the same function as bracket reference feature 58 of locating bracket 40 of the embodiment of FIGS. 2-8C. Reference feature 94 of multiple-pin connector 92 can incorporate a threaded insert to which audio connector 38 and retainer 42 may be screwed to constrain those components to multiple-pin connector 92. Advantageously, coupling audio connector 38 and retainer 42 directly to multiple-pin connector 92 may constrain the audio connector and the retainer to the multiple-pin connector with greater precision and fewer parts.

Figure 10A:
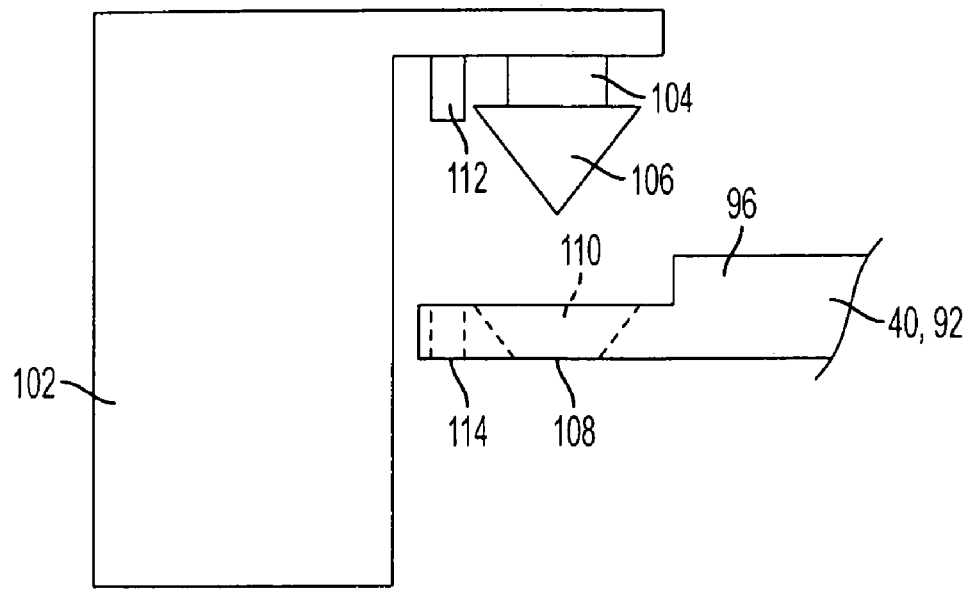
FIGS. 10A-10B illustrate a third embodiment in accordance with the present invention.
Figure 10B:
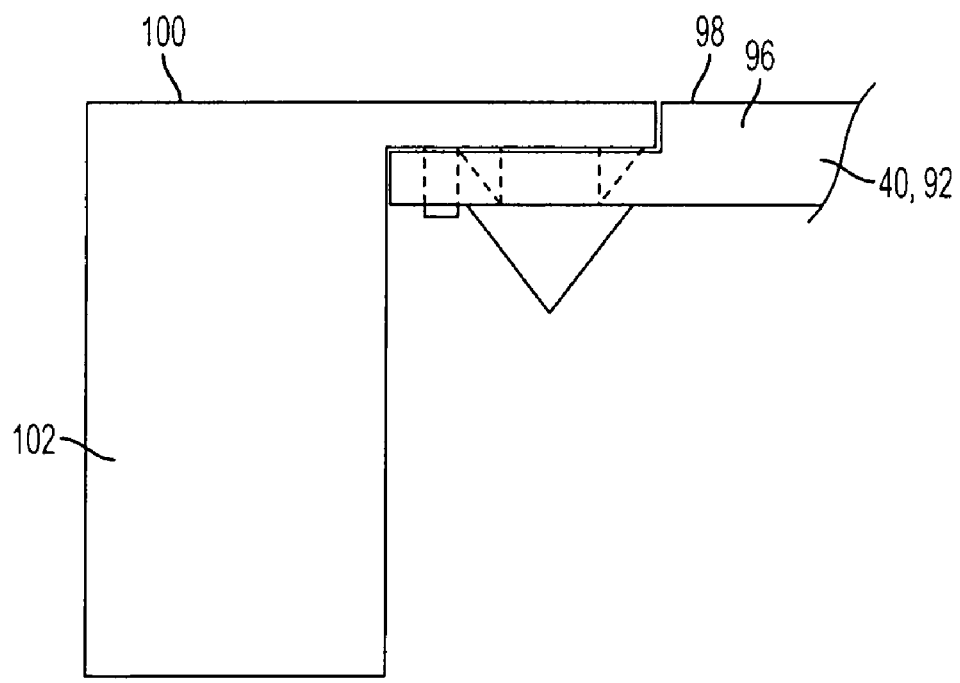

FIGS. 10A-B presents a third embodiment of the present invention. The third embodiment of the present invention may be designed similarly to the previously described embodiments except in two respects. First, the retainer can be integrated with either locating bracket 40 of the embodiment of FIGS. 2-8C or multiple-pin connector 92 of the embodiment of FIG. 9. Second, the audio connector can be coupled to locating bracket 40 of the embodiment of FIGS. 2-8C or multiple-pin connector 92 of the embodiment of FIG. 9 with an alternative fastener.

Rather than having a retainer that is structurally independent of other components of an electronic device, the function of the retainer can be integrated with either locating bracket 40 of FIGS. 2-8C or multiple-pin connector 92 of FIG. 9. That is, multiple-pin connector 92 may include retaining portion 96 that can extend the depth of the multiple-pin connector so that outer facing surface 98 of the connector forms a single plane (or any predetermined surface) with outer facing surface 100 of audio connector 102 when the components are assembled together. End cap 44b then can be coupled to that single plane, thereby accurately locating the end cap with respect to the multiple-pin connector. Likewise, locating bracket 40 may integrate body portion 72 of retainer 42 (see FIG. 7), thereby providing outer surface 98 to which end cap 44b may be coupled. While FIGS. 10A and 10B only show a portion of retaining portion 96, it should be understood that retaining portion 96 can extend along the longitudinal length of locating bracket 40 or multiple-pin connector 92.

Instead of coupling the audio connector to locating bracket 40 of FIGS. 2-8C or multiple-pin connector 92 of FIG. 9 with a separate fastener, such as a screw, audio connector 102 of FIGS. 10A and 10B can be coupled to the locating bracket or multiple-pin connector with a self-locking fastener. Self-locking fastener, which can serve as a reference feature for audio connector 102, can include shaft 104 and head 106. Head 106 may have a cross-sectional area that can be larger than the shaft at least at a portion of the head.

The self-locking fastener may be configured to be coupled to complementary reference feature 108 disposed in locating bracket 40 of FIGS. 2-8C or multiple-pin connector 92 of FIG. 9. Reference feature 108 can include through-hole 110 having a cross-sectional shape that can complement that of head 106. In one embodiment of the present invention, head 106 and through-hole 110 can have shapes that facilitate insertion of head 106 into through-hole 110 but can prevent head 106 from being easily pulled out of through-hole 110 once at least a portion of the head has cleared at least a portion of the through-hole. In the embodiment of FIGS. 10A-10B, when head 106 is inserted through hole 110, shaft 104 may be disposed within hole 110 while head 106 rests against an outer surface of reference feature 108.

Audio connector 102 also may have reference feature 112 configured to couple to reference feature 114 of locating bracket 40 of FIGS. 2-8C or multiple-pin connector 92 of FIG. 9. Reference feature 112 may include a shaft having any cross-sectional shape that may be uniform along the length of the shaft. Reference feature 114 may include a through-hole having a shape that may be complementary to that of reference feature 112. When reference feature 112 is coupled to reference feature 114, audio connector 102 may be prevented from rotating with respect to locating bracket 40 or multiple-pin connector 92.

Although particular embodiments of the present invention have been described above in detail, it will be understood that this description is merely for purposes of illustration. Alternative embodiments of those described hereinabove are also within the scope of the present invention. For example, although FIGS. 2-10B have presented some methods and devices to couple together multiple components of an electronic device, an electronic device may use other types of coupling methods or devices known in the art or otherwise, e.g., other types of self-locking fasteners, clips, bolts, adhesives, etc.

Although the embodiments of the present invention presented hereinabove describe pin and audio connectors, the present invention may be applied to constrain other types of connectors in one or more degrees of freedom without departing from the scope of the present invention. For example, the connectors can transmit or receive audio, video, other data, or a combination thereof. Furthermore, while the embodiments of the present invention illustrate two connectors being constrained, the teachings of the present invention may be applied to constrain any number of connectors.

While the description provided herein describes some components of an electronic device, the device may include additional components, e.g., user input components 116, display 118, and/or additional components of the electronic device that have not been shown for simplicity of illustration.

User input component 116 can provide an interface for a user to input information into the electronic device. In one embodiment of the present invention, user input component 116 may be a trackwheel similar to that used by an iPod™ sold by Apple Computer, Inc. of Cupertino, Calif. The trackwheel can include one or more buttons for selecting software entries and a capacitive touchpad. The touchpad may permit a user to scroll through software menus. In alternative embodiments, user input component 116 may include, for example, one or more buttons, a touchpad, a touchscreen display, electronics for accepting voice commands, antennas, infrared ports, or combinations thereof.

Combinations of the above-described embodiments of the present invention or portions thereof may be provided in one electronic device unit.

One of ordinary skill in the art will understand that, while the above-described embodiments of the present invention may facilitate certain manufacturing techniques and/or housing designs, those embodiments are not necessarily limited thereto. For example, while the described embodiments of the present invention may facilitate assembly of components into the electronic device housing from openings disposed on opposing ends of the housing, the embodiments also may be incorporated into an electronic device having housings in which the main body of the housing includes multiple parts. An example of such a multi-part housing includes a clamshell housing. The housing of an electronic device of the present invention also may include housings in which the main body includes only one piece. An example of such a housing includes housing 18 and 32 of FIGS. 1B and 2. A housing of the present invention may provide only one opening through which components are inserted or multiple openings that can be disposed, for example, on multiple sides of the housing.

The present invention can be incorporated in any electronic device, including any portable, mobile, hand-held, or miniature consumer electronic device that may require multiple connectors or connector parts. Illustrative electronic devices can include, but are not limited to, music players, video players, still image players, game players, other media players, music recorders, video recorders, cameras, other media recorders, radios, medical equipment, calculators, cellular phones, other wireless communication devices, personal digital assistances, programmable remote controls, pagers, laptop computers, printers, or combinations thereof. Miniature electronic devices may have a form factor that is smaller than that of hand-held devices. Illustrative miniature electronic devices can include, but are not limited to, watches, rings, necklaces, belts, accessories for belts, headsets, accessories for shoes, virtual reality devices, other wearable electronics, accessories for sporting equipment, accessories for fitness equipment, key chains, or combinations thereof.

The above described embodiments of the present invention are presented for purposes of illustration and not of limitation, and the present invention is limited only by the claims which follow.

What is claimed is:

1. A portable electronic device comprising:
   a housing having first and second openings disposed at different sides of the housing;
   a first assembly comprising at least one circuit board coupled to a first connector, the first opening having dimensions that permit the first assembly to be inserted therethrough;
   a second connector having a first surface, the second opening having dimensions that permit the second connector to be inserted therethrough; and
   a bracket disposed within the housing between the first and second openings that couples the first connector to the second connector.

2. The electronic device of claim 1, wherein the bracket comprises a second surface, the first and second surfaces forming a single plane when the bracket is coupled to the first assembly.

3. The electronic device of claim 1, wherein:
   the first connector comprises a first reference feature aligned to a second reference feature disposed on the bracket; and
   the second connector comprises a third reference feature aligned to a fourth reference feature disposed on the bracket.

4. The electronic device of claim 1, wherein the first connector is a multiple-pin connector.

5. The electronic device of claim 1, wherein the second connector is an audio connector.

6. The electronic device of claim 1, wherein the first and second openings of the housing are disposed on opposite ends of the housing.

7. The electronic device of claim 1, wherein the electronic device is a hand-held electronic device.

8. The electronic device of claim 1, wherein the electronic device is a miniature electronic device.

9. A system comprising:
   the electronic device of claim 1; and
   an accessory having third and fourth connectors, wherein the third and fourth connectors are mechanically and electrically coupled to the first and second connectors.

10. The electronic device of claim 1, wherein:
    the first connector comprises a protuberance; and
    the bracket comprises a depression that surrounds the protuberance and constrains the bracket to the first connector in at least one direction.

11. The electronic device of claim 1, wherein:
    the bracket comprises a protuberance; and
    the first connector comprises a depression that surrounds the protuberance and constrains the bracket to the first connector in at least one direction.

12. The electronic device of claim 1, wherein the bracket is coupled to the first connector by solder.

13. The electronic device of claim 1, wherein the bracket is coupled to the first connector by an adhesive.

14. The electronic device of claim 1, wherein:
the second connector comprises a through-hole; and
the bracket comprises a threaded insert that is coupled to the through-hole by a screw.

15. The electronic device of claim 14, wherein the screw constrains the bracket to the second connector in at least one direction.

16. A portable electronic device comprising:
a housing having first and second openings disposed at different sides of the housing;
a first assembly comprising at least one circuit board coupled to a first connector, the first opening having dimensions that permit the first assembly to be inserted therethrough;
a second connector having a first surface, the second opening having dimensions that permit the second connector to be inserted therethrough;
a bracket that couples the first connector to the second connector; and
a retainer having a second surface, the first and second surfaces forming a single plane when the retainer is coupled to the bracket.

17. The electronic device of claim 16, wherein the retainer further comprises a retainer opening and the retainer opening is disposed over the first connector to provide external access to the first connector.

18. The electronic device of claim 16, wherein the housing further comprises an end cap, wherein the end cap is coupled to the single plane formed by the first and second surfaces, the end cap having third and fourth openings, the third opening providing external access to the first connector, the fourth opening providing external access to the second connector.

19. A portable electronic device comprising:
a housing having first and second openings disposed at different sides of the housing;
a first assembly comprising at least one circuit board coupled to a first connector, the first opening having dimensions that permit the first assembly to be inserted therethrough;
a second connector having a first surface, the second opening having dimensions that permit the second connector to be inserted therethrough; and
a bracket that couples the first connector to the second connector, wherein:
the first connector comprises a first reference feature aligned to a second reference feature disposed on the bracket; and
the second connector comprises a third reference feature aligned to a fourth reference feature disposed on the bracket, the electronic device further comprising:
a retainer having a second surface and a fifth reference feature, the fifth reference feature aligned to the fourth reference feature of the bracket when the retainer is coupled to the bracket, the first and second surfaces forming a single plane when the retainer is coupled to the bracket.

20. A portable electronic device comprising:
a housing having first and second openings disposed at different sides of the housing;
a first assembly comprising at least one circuit board coupled to a first connector, wherein the first assembly has a cross-sectional area that is equal to or less than that of the first opening;
a second connector having a first surface, wherein the second connector has a cross-sectional area that is equal to or less than that of the second opening; and
a bracket that couples the first connector to the second connector, wherein the bracket is coupled to the second connector by a screw.

21. A method for manufacturing a portable electronic device, wherein the electronic device comprises a housing, a first connector, a second connector, and a bracket, wherein the housing has first and second openings disposed on different sides of the housing, wherein the second connector has a first surface, the method comprising:
aligning a first reference feature on the bracket to a second reference feature on the first connector;
coupling the bracket to the first connector with the first and second reference features aligned;
inserting the first connector and the bracket through the first opening of the housing;
inserting the second connector through the second opening in the housing;
aligning a third reference feature on the second connector to a fourth reference feature on the bracket; and
coupling the second connector to the bracket with the third and fourth reference features aligned.

22. The method of claim 21, wherein the electronic device is a hand-held electronic device.

23. The method of claim 21, wherein the electronic device is a miniature electronic device.

24. The method of claim 21, wherein:
the third reference feature is a through-hole; and
the fourth reference feature is a threaded insert.

25. The method of claim 24, further comprising providing a screw within the through-hole and the threaded insert.

26. The method of claim 21, further comprising screwing the bracket to the second connector.

27. The method of claim 21, further comprising at least one of adhering, welding, and soldering the bracket to the first connector.

28. A method for manufacturing a portable electronic device, wherein the electronic device comprises a housing, a first connector, a second connector, a retainer having a second surface, and a bracket, wherein the housing has first and second openings disposed on different sides of the housing, wherein the second connector has a first surface, the method comprising:
aligning a first reference feature on the bracket to a second reference feature on the first connector;
coupling the bracket to the first connector with the first and second reference features aligned;
inserting the first connector and the bracket through the first opening of the housing;
inserting the second connector through the second opening in the housing;
aligning a third reference feature on the second connector to a fourth reference feature on the bracket;
coupling the second connector to the bracket with the third and fourth reference features aligned;
inserting the retainer through the second opening in the housing;
aligning a fifth reference feature on the retainer to the fourth reference feature on the bracket;
coupling the retainer to the bracket with the fourth and fifth reference features aligned; and
providing a single plane formed by the first and second surfaces.

29. The method of claim 28, wherein the housing comprises an end cap having third and fourth openings, the method further comprising:
aligning the third opening with the first connector;
aligning the fourth opening with the second connector; and coupling the end cap to the single plane formed by the first and second surfaces.

30. An electronic device comprising:
a housing;
a first assembly having at least a circuit board coupled to a first connector, wherein the first connector has a first reference feature;
a second connector having a first surface and a second reference feature, wherein the first connector is coupled to the second connector; and
a retainer having a second surface, the first and second surfaces forming a single plane when the retainer is coupled to the first assembly.

31. The electronic device of claim 30, wherein:
the housing comprises first and second openings disposed at different sides of the housing;
the first opening has dimensions that permit the first assembly to be inserted therethrough; and
the second opening has dimensions that permit the second connector to be inserted therethrough.

32. The electronic device of claim 30, wherein a portion of the housing is coupled to the single plane formed by the first and second surfaces, the portion of the housing having third and fourth openings, the third opening providing external access to the first connector, the fourth opening providing external access to the second connector.

33. The electronic device of claim 30, wherein the first connector is coupled directly to the second connector.

34. The electronic device of claim 30, wherein
the second reference feature is aligned to the first reference feature.

35. An electronic device comprising:
a housing;
a first assembly having at least a circuit board coupled to a first connector, wherein the first connector has a first reference feature;
a second connector having a first surface and a second reference feature, wherein the first connector is coupled to the second connector;
a retainer having a second surface, the first and second surfaces forming a single plane when the retainer is coupled to the first assembly; and
a bracket that couples the first connector to the second connector.

36. The electronic device of claim 35, wherein:
the bracket has third and fourth reference features,
the third reference feature is aligned with the first reference feature on the first connector; and
the fourth reference feature is aligned with the second reference feature on the second connector.

* * * * *